(12) United States Patent
Drapkin et al.

(10) Patent No.: US 6,362,942 B2
(45) Date of Patent: *Mar. 26, 2002

(54) INPUT STAGE PROTECTION CIRCUIT FOR A RECEIVER

(75) Inventors: Oleg Drapkin, North York; Grigori Temkine, Toronto, both of (CA)

(73) Assignee: ATI International SRL, Barbados (BB)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/272,857
(22) Filed: Mar. 19, 1999
(51) Int. Cl.[7] ................................................. H02H 3/20
(52) U.S. Cl. .............................. 361/90; 361/111; 361/56
(58) Field of Search .............................. 361/54, 56, 88, 361/90, 91.1, 91.4, 92, 111; 257/355, 357

(56) References Cited

U.S. PATENT DOCUMENTS

| 5,319,259 A | * | 6/1994 | Merrill ........................ 326/21 |
| 5,333,093 A | * | 7/1994 | Krautschneider et al. ...... 361/56 |
| 5,793,592 A | * | 8/1998 | Adams et al. ................. 361/90 |
| 5,905,621 A | * | 5/1999 | Drapkin ....................... 361/111 |

* cited by examiner

Primary Examiner—Kim Huynh
(74) Attorney, Agent, or Firm—Vedder, Price, Kaufman & Kammholz

(57) ABSTRACT

An extraneous voltage protection circuit and method transforms an overvoltage input signal or undervoltage input signal to a suitable voltage level for a protected circuit. An input voltage dependent variable reference voltage is used to protect overvoltage protection circuitry against unsuitable undervoltage conditions. In one embodiment, an overvoltage protection circuit, an undervoltage protection circuit, and an input voltage dependent variable reference voltage source is made of single gate oxide MOS devices.

35 Claims, 3 Drawing Sheets

INPUT STAGE PROTECTION CIRCUIT FOR A RECEIVER

CROSS REFERENCE TO RELATED APPLICATION

This is a related application to application entitled "Voltage Scaling Circuit For Protecting An Input Node To A Protected Circuit" having Ser. No. 09/004,795, filed on Jan. 9, 1998, issued as U.S. Pat. No. 5,905,621 on May 18, 1999 owned by instant assignee and hereby incorporated by reference.

FIELD OF THE INVENTION

The invention relates generally to overvoltage and combined undervoltage protection circuits for protecting other circuits from higher and lower than desired voltage levels, and more particularly to voltage scaling circuits for protecting an input to a protected circuit.

BACKGROUND OF THE INVENTION

With the continued demand for higher speed and lower power consumption integrated circuits a need exists for simple, low cost and reliable over voltage and undervoltage protection circuits. For example, CMOS based video graphics chips with 128 input/output ports (I/O) ports are required to operate at clock speeds in excess of 250 MHz. Such devices may use a 1.8 V power supply for much of its logic to reduce power consumption. One way to increase the operating speed of such devices is to decrease the gate oxide thickness and gate length of core circuitry transistors. However, a decrease in the gate oxide thickness and gate length of MOS devices can reduce the gate-source (gate-drain) operating voltage to lower levels. For example, where an integrated circuit contains digital circuitry that operates from a 1.8 V source and is fabricated using silicon dioxide gate thickness of 30 Å, a resulting maximum operating voltage may be approximately two volts. Such IC's must often connect with more conventional digital devices that operate at or 3.3 V. A problem arises when the core logic circuitry (operating, for example, at 1.8 V) receives 3.3 V digital input signals from peripheral devices on input pins. Such standard 3.3 V input signals can cause gate oxide damage if suitable voltage protection is not incorporated.

FIG. 1 shows a known over voltage protection arrangement that attempts to overcome the overvoltage problem. As seen, a resistor R is placed in the input path from an input pin P to the input I of a MOS based core logic stage, such as an input/output port on a CPU or other processing unit. A clamping diode D is placed across the input I of the core logic stage and is connected to a 2.5 V supply voltage used by the core logic to clamp over voltages coming from pin P. In operation, resistor R restricts current flow to the core logic circuit and a voltage drop occurs across the resistor. When an input voltage is high enough to cause the diode D to conduct, the diode clamps the input voltage to a fixed level (2.5 V+diode junction voltage drop). Several problems arise with such a configuration. If the core logic is fabricated with gate widths of 50 Å, an input voltage of only 2.8 V is required to damage the core logic stage. With the diode drop of approximately 0.7 volts, a 3.5 V input voltage is a maximum input voltage to the core logic stage. However, with this 3.5 V level of damage voltage over temperature and time, circuit reliability may be compromised. This problem is more prevalent as the core logic supply voltage is reduced to 1.8V and the gate thickness is based on 0.18 um technology wherein the gate thickness is on the order of 30 Å or smaller gate thicknesses. Also, the clamp diode D allows additional current to flow through the substrate which can cause latch-up of core logic circuitry.

Another problem is the use of resistor R. Such resistive elements take up large areas on integrated circuits and dissipate large amounts of power, hence heat, when an input voltage such as 5 volts is placed on pin P. In addition, a large time delay can occur due to the resistor R and the parasitic capacitance of the gate junction of the core logic circuit. This time delay reduces the speed of operation of the system.

In addition, receivers may also experience undervoltage conditions, such as negative voltage undershooting due to different ground potentials between the peripheral circuitry and the receiver circuitry. With higher speed circuits, such as those using 0.18 micrometer MOS gate thicknesses, and having a 1.8 V supply voltage, such circuits may have to receive higher input voltages such as 3.3 V from peripheral circuits. An undesirable undervoltage condition, such as a −0.4 V input signal may be experienced. As such, for a 1.8 V based receiver, the input on a node may experience a total potential of 1.8 V plus −0.8 V resulting in a 2.6 V potential across a gate to drain or gate to source of a receiver transistor. This potential is typically higher than the normal operating voltage (2 V) and can damage the receiver MOS devices. Accordingly, it would be desirable to control an input voltage to a receiver such that undervoltage conditions and overvoltage conditions do not damage the receiver circuitry or the core logic circuitry or other circuit that has to be protected.

Moreover, there are different voltage supplies that are being used to power CMOS chip cores and I/O pads as well as different voltage level of input signals that are received or operated by the I/O pads. For example, with 0.18 micrometer technology, the core voltage may be 1.8 V based supply and I/O pad circuitry may be 2.5 V or 3.3 V. As such, the voltage level of the input signals to the I/O pads may be 2.5 V or 3.3 V. If it is desired to make a single gate oxide core logic and I/O pad logic, greater chips speeds and power reduction can occur. However, the 2.5 V or 3.3 V input signals could damage such transistors. In addition, as mentioned above, input signals can have an undershoot of 0.4 V or more.

Consequently there exists a need for a protection circuit that reduces power consumption, improves the speed of operation of a system in a simple and reliable manner. It would desirable if the protection circuit provided voltage scaling in a cost effective manner and also provided undervoltage protection (e.g., protection against negative input voltages).

BRIEF DESCRIPTION OF THE DRAWINGS

The invention will be more fully understood with reference to the below-identified drawings.

DETAILED DESCRIPTION OF A PREFERRED EMBODIMENT OF THE INVENTION

Briefly, an extraneous voltage protection circuit and method transforms an overvoltage input signal or undervoltage input signal to a suitable voltage level for a protected circuit. An input voltage dependent variable reference voltage is used to protect overvoltage protection circuitry against unsuitable undervoltage conditions.

In one embodiment, an overvoltage protection circuit, an undervoltage protection circuit, and an input voltage dependent variable reference voltage source is made of single gate oxide MOS devices. The circuits may be included on a substrate or die common to receiver circuitry and/or core logic circuitry. An overvoltage protection circuit is operatively coupled to an input signal node to receive an input signal that may include undervoltage signals, such as negative voltages, and overvoltage, such as signal levels higher than a maximum normal operating voltage used for the extraneous voltage protection circuit.

Figure 1:
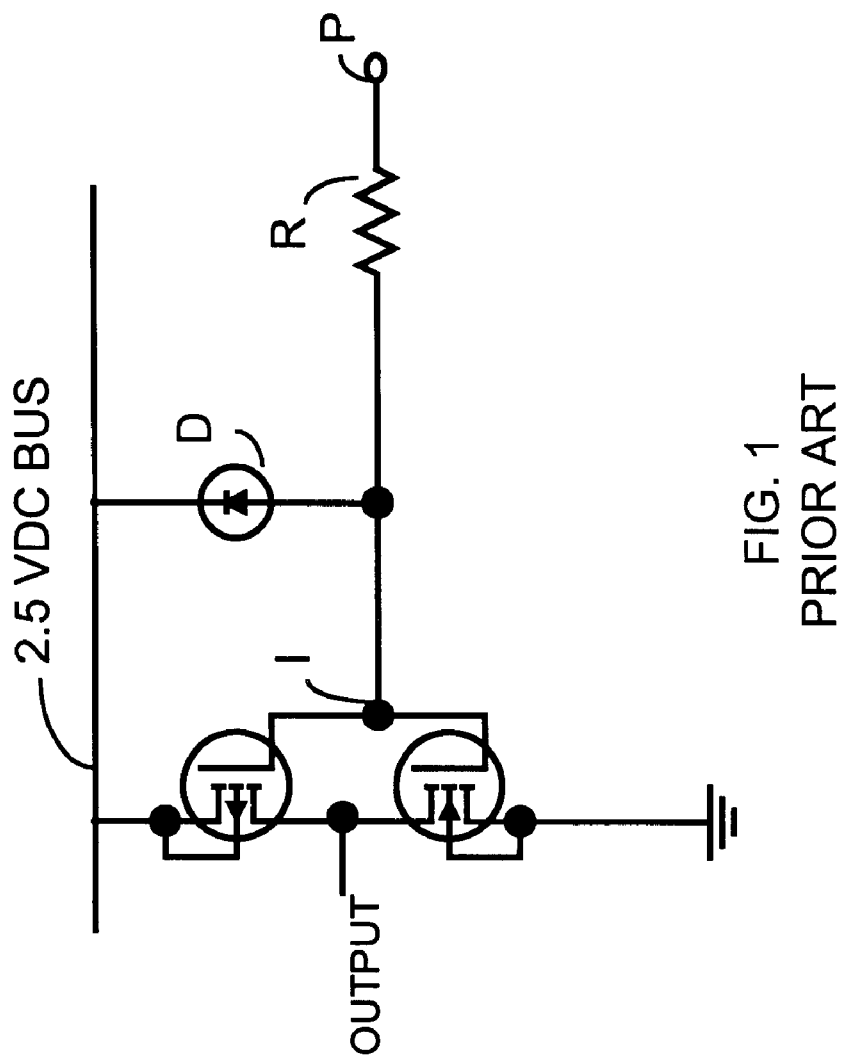
FIG. 1 is circuit diagram of one example of a conventional overvoltage protection circuit.
Figure 2:
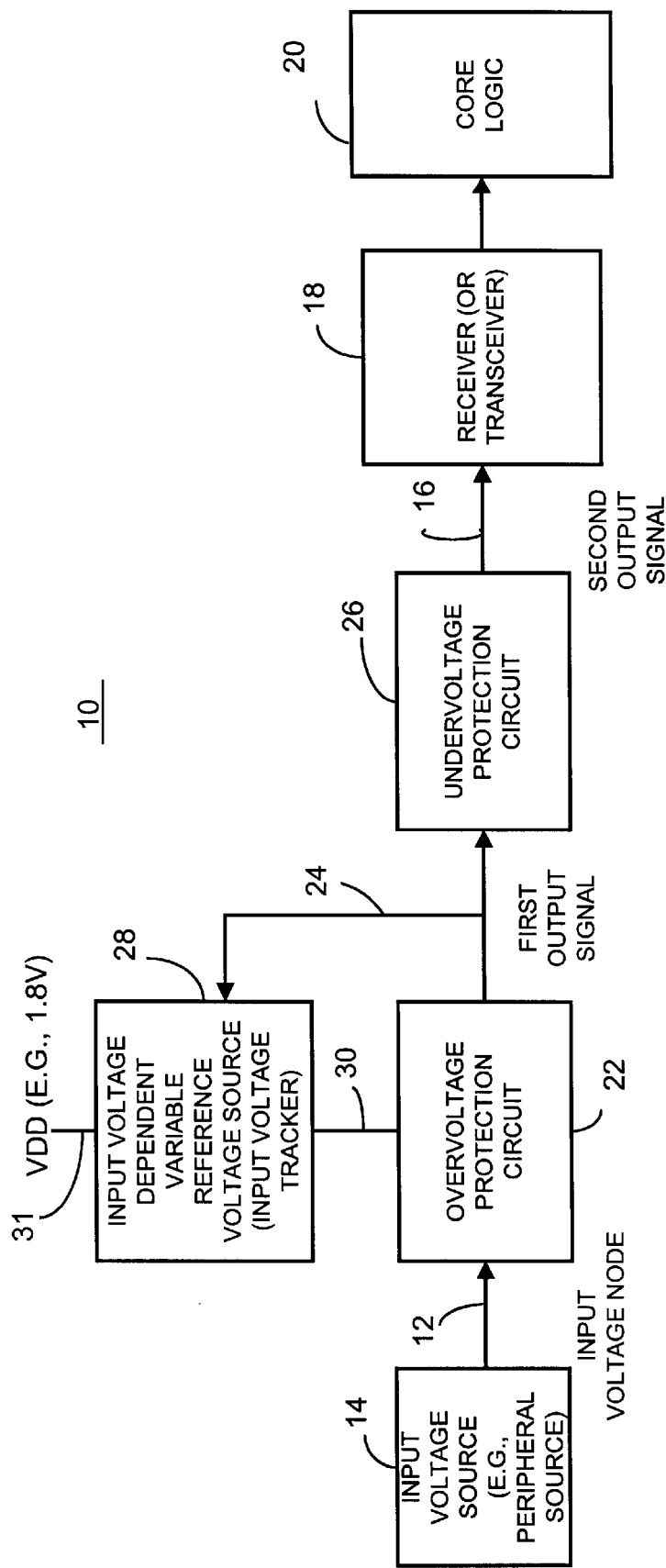
FIG. 2 is a block diagram illustrating one embodiment of an extraneous voltage protection circuit such as an input stage protection circuit for a receiver, in accordance with one embodiment of the invention.

FIG. 2 shows one example of an extraneous voltage protection circuit 10 operably coupled to an input signal node 12 that receives an input signal from an input voltage source 14, such as a peripheral voltage source. The extraneous voltage protection circuit 10 provides an output signal 16 to an input node of a protected circuit 18, such as an integrated circuit receiver, transceiver, core logic or other suitable circuitry. If desired, the receiver 18 may transfer received signals to the core logic 20. The receiver (FIG. 1) may be, for example, an input stage of an I/O port. The extraneous voltage protection circuit 10, receiver 18 and core logic is preferably, but not necessarily, integrated into a common monolithic integrated circuit wherein the circuits are of a single gate oxide type, such as MOS transistor based 0.18 micrometer gate thickness technology or less.

The extraneous voltage protection circuit 10 serves as an input stage protection circuit for the receiver 18. The extraneous voltage protection circuit 10 includes an overvoltage protection circuit 22 that is coupled to the input signal node 12 and generates a first output signal 24. The extraneous voltage protection circuit also includes an undervoltage protection circuit 26 that operatively receives the first output signal 24 and generates a second output signal 16 that is coupled to the input node of the protected circuit 18. In addition, the extraneous voltage protection circuit 10 includes an input voltage dependent variable reference voltage source 28 that is operative to, among other things, protect the overvoltage protection circuit 22 against unsuitable undervoltage signals received on the input voltage node 12. The input voltage dependent variable reference voltage source serves as a type of input voltage tracker that generates an input voltage dependent variable reference voltage signal 30 in response to the voltage level of the input signal received on the input signal voltage node 12. The input voltage dependent variable reference voltage source varies the variable reference voltage signal 30 to one level for overvoltage protection circuit 22 during undervoltage conditions and to a different level during overvoltage conditions.

The overvoltage protection circuit 22 effectively shifts the input signal from a first logic high level to a lower logic high level when the input signal is in an unsuitable overvoltage condition. The undervoltage protection circuit 26 shifts or otherwise converts the first output signal from the overvoltage protection circuit from a negative voltage level to a non-negative logic low level when the input signal is an unsuitable undervoltage value (condition). Accordingly, the second output signal 16 is scaled to be within a suitable range for logic low and logic high levels for the receiver 18 irrespective of whether the input voltage on the input voltage node 12 is an overvoltage or undervoltage value.

The input voltage dependent variable reference voltage source 28 receives the first output signal 24 as a type of feedback signal and adjusts the variable reference voltage signal 30 for the overvoltage protection circuit 22 during the undervoltage conditions. Also, the input voltage dependent variable reference voltage source 28 is coupled to a supply voltage 31 such as a 1.8 V supply voltage or other suitable supply voltage.

It will be recognized that the extraneous voltage protection circuit 10 may be applied to a plurality of receiver circuits located on an integrated circuit, for example, wherein each receiver circuit receives an input voltage from a peripheral or non-peripheral input voltage source.

Figure 3:
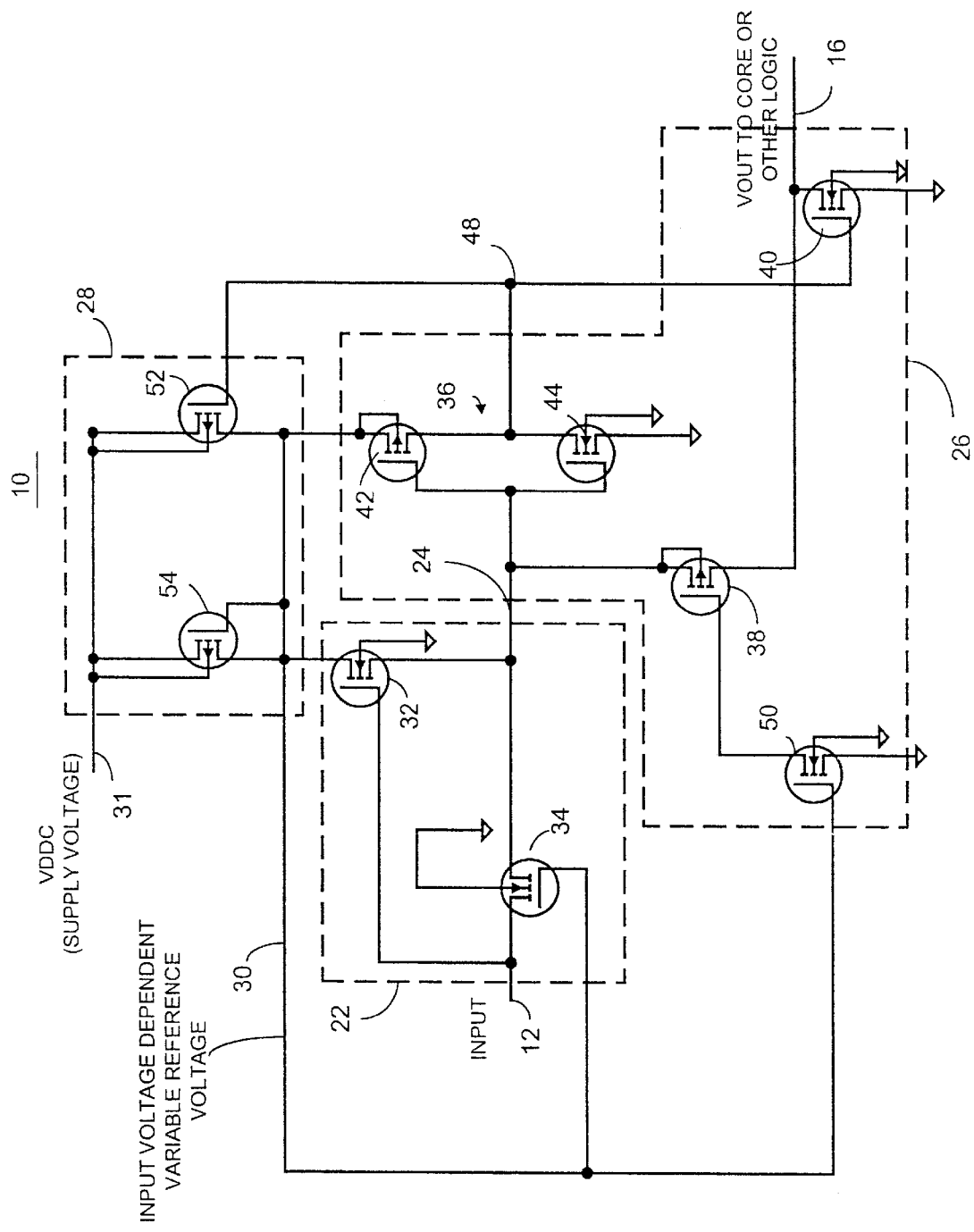
FIG. 3 is a circuit diagram illustrating one example of an extraneous voltage protection circuit in accordance with one embodiment of the invention.

FIG. 3 shows, by way of example, a circuit diagram illustrating one embodiment of the extraneous voltage protection circuit 10. In this example, the overvoltage protection circuit 22 is structured as a voltage shifting circuit that is operatively interposed between the input node to the protected circuit 16 and the input signal node 12 that receives an overvoltage or undervoltage input signal. The voltage shifting circuit includes a first circuit 32 (here an nmos transistor) coupled to the input voltage dependent variable reference voltage source 28 and to the input signal node 12 wherein the first circuit is configured as a unidirectional voltage follower. The voltage shifting circuit also includes a second circuit 34 (here another nmos transistor) that is operatively coupled to the input voltage dependent variable reference voltage source 28 and to the input signal node 12 and is configured as a bi-directional voltage follower to facilitate input high voltage level shifting between the input signal node and the input node to the protected circuit. One example of such a circuit is described in co-pending application entitled "VOLTAGE SCALING CIRCUIT FOR PROTECTING AN INPUT NODE TO A PROTECTED CIRCUIT", having Ser. No. 09/004,795, filed Jan. 9, 1998 issued as U.S. Pat. No. 5,905,621, and owned by instant Assignee.

The receiver (FIG. 1) may be, for example, an input stage of an IO port. In this example, the first circuit is a nmos transistor having a gate coupled to the input signal node so that the gate receives incoming digital input signals for the protected circuit. The nmos transistor 32 has a drain operatively coupled to the input signal dependent variable reference voltage source and its source is coupled to a source of another nmos transistor (e.g., second circuit 34). The second circuit 34 includes an nmos transistor having its gate coupled to receive the input signal dependent variable reference voltage. In addition, its drain is coupled to the input signal node so that the drain receives the incoming digital input signals for the protected circuit. Its source is coupled to the source of the nmos transistor of the first circuit as shown. The combination of the nmos transistors facilitates input high voltage level shifting between input signal node and the input node to the protected circuit. The nmos transistors may be any suitable field effect transistors, or other transistors or any other suitable devices or combination of devices.

Preferably, the gate thickness of the nmos transistor is the same as the gate thickness of the protected circuit, such as a gate thickness of 30 Å or less to provide a single gate oxide system. The voltage shifting circuit is fabricated on the same substrate as the protected circuit in the form of a monolithic integrated circuit. In this way, fabrication is enhanced by having a same gate oxide thickness for all devices. This avoids having to fabricate additional larger gate oxide thicknesses for overvoltage protection circuits during fabrication. In this embodiment, the protected circuit, such as a receiver, and the extraneous voltage protection circuits, are on a common I/O pad of a monolithic integrated circuit, although any other suitable configuration may also be used.

Also in this example, the undervoltage protection circuit 26 includes an inverter 36 having an input coupled to the first output signal 24 and to a logic high driving transistor 38. The inverter 36 has an output coupled to a logic low driving transistor 40 and to a variable reference voltage drive transistor 52. The input dependent variable reference voltage source 28 supplies the variable reference voltage signal 30 to the inverter circuit 36, as well as to the overvoltage protection circuit 22 and nmos transistor 50 as protection against undesired gate to drain voltage ranges to inverter transistors 42 and 44. As shown, inverter transistor 42 may be a pmos transistor having a gate coupled to receive a second output voltage and also coupled to a gate of nmos transistor 44. The drain of pmos transistor 42 is operably coupled to the drain of nmos transistor 44 which provides the inverter output voltage 48. The inverter output voltage 48 drives the logic low driving transistor 40 and the variable reference voltage drive transistor 52.

The undervoltage protection circuit also includes, if desired, an isolation transistor 50 that protects the logic high driving transistor 38 from electrostatic discharge damage, for example, so that its input (e.g., gate) is not directly connected to a supply voltage line. As shown, the gate of the isolation transistor 50 receives the input voltage dependent variable reference voltage signal 30. The drain of the isolation transistor 50 is operably coupled to the gate of the logic on the logic high driving transistor 38. A source of the isolation transistor 50 is operably coupled to circuit ground.

The overvoltage protection circuit input transistor 34 has a gate operatively coupled to the variable reference voltage signal 30 and has a drain coupled to the input signal node such that the variable reference voltage provides a variable gate to drain voltage within a normal operating range for the overvoltage protection circuit input transistor 34 during unsuitable undervoltage conditions. For example, if the input signal on input signal node 12 is a –0.4 volts, for example, the variable reference voltage source 28 will decrease the variable reference voltage signal 30 in an attempt to try to protect the transistor 34 from having too large of a gate to drain voltage during undervoltage conditions. The extraneous voltage levels on the input signal node 12 may range, for example, between –0.4 V to 3.3 V depending on, for example, different input voltages between ground potentials of the peripheral circuit and the extraneous voltage protection circuit and core logic receiver circuit. In addition, the 3.3 V signal may come from a peripheral device having a 3.3 V supply voltage, for example.

The input signal dependent variable reference source 28 may also include the inverter 36 such that the output voltage from the inverter 48 serves to drive the variable reference voltage drive transistor 52 to provide a suitable variable reference voltage signal 30 based on, for example, an overvoltage condition to protect, for example, the gate to drain of transistor 42. The input voltage dependent variable reference voltage source 28 also includes another variable reference voltage drive transistor 54 in parallel with transistor 52. Transistor 54 has a gate operably coupled to the inverter transistor 42, the drain of pmos transistor 52 and to the drain of nmos transistor 32. A source is coupled to the supply voltage. Likewise, the source of transistor 52 is also coupled to the supply voltage.

As noted, the extraneous voltage protection circuit 10 preferably has the transistors made of a single gate oxide such that single gate oxide devices are used for the receiver and the extraneous protection circuitry. The single gate oxide devices may have gate oxide thicknesses of 30 Å or less. Also, the supply voltage for the input dependent variable reference voltage source may be 1.8 V or any other suitable voltage. The above configuration controls the input voltage to the receiver while accomplishing several goals. For example, it is desirable to protect a receiver against negative voltages so that the receiver only receives, for example, 0 volts or other low non-negative value as its logic low level to avoid voltage potential ranges that damage the single gate oxide receiver devices during normal operation. In addition, it is necessary to protect gates of the extraneous protection circuitry and receiver circuitry from exceeding maximum operating voltage levels so that the circuits are not degraded over time. As such, the input voltage dependent variable reference voltage signal 30 is used to control gate to source and gate to drain voltages within maximum operating levels for the extraneous protection circuitry devices and the receiver devices.

Also, in operation, the input signal level may range, for example, from –0.4 V to, for example, 3.3 V depending upon the input signal source. The extraneous voltage protection circuit 10 provides the output 16 that is within 0 V to the supply voltage range $V_{DDC}$, such as 1.8 V, for the receiver or core logic. As such, for negative input voltages, the output voltage level 16 will be 0 V instead of a negative voltage. When the input voltage is an overvoltage, such as 3.3 V (compared to the 1.8 V supply voltage) the output voltage 16 will reach a maximum of approximately 1.8 V. In this way, the receiver does not experience undervoltage or overvoltage conditions. More particularly, when the input signal on node 12 is approximately less than or equal to the variable reference voltage signal 30 minus a gate to drain voltage drop of transistor 32, the overprotection circuit 22 passes the input signal but cuts all signals over approximately $V_{DDC}$–$V_T$ (1.8 V–about 0.6 V) to protect against overvoltage. If the input signal on the input node 12 is higher than a reference voltage signal 30 plus a threshold gate to drain voltage, the nmos transistor 32 is completely on and scales the input node voltage to the variable reference voltage level. In this way, during the rising edge of an input signal from 0 to 3.3 V, for example, the protected circuit input will never exceed the variable reference voltage level. As the voltage input signal increases from 0 to 3.3 V, the nmos transistor 34 provides a following input signal voltage to the undervoltage protection circuit as well as a feedback signal to the input dependent variable reference voltage source.

Input voltage dependent variable reference source transistor 54 effectively provides the variable reference voltage equal to $V_{DDC}$–$V_T$ when the input signal is approximately 0.8 V and even a negative potential (it has to be less than the switching point of the inverter 36). Then pmos transistor 42 would be "on" to shut off pmos transistor 52. In that case, variable reference voltage signal 30 is equal to $V_{DDC}$–$V_{T54}$, where $V_{T54}$ is a threshold voltage on pmos transistor 52. If the variable voltage reference supply source 28 includes transistor 52 so that when the input signal is larger than the supply voltage, the variable reference voltage signal 30 is equal to $V_{DDC}$ (nmos) transistor 44 is "on" as well as pmos transistor 52).

The inverter output signal 48 serves as feedback to detect when the input voltage is exceeding $V_{DDC}$. As such, the transistor 52 is turned on thereby keeping the reference voltage to the maximum of $V_{DDC}$. Also, the inverter effectively will take a negative voltage seen from output signal 24 and invert it to a high voltage which then turns on transistor 40 to insure that the output signal 16 is approximately 0 V and not negative.

The nmos transistor 50 is always on to protect against electrostatic discharge damage, for example, to effectively provide 0 V to logic high level drive transistor 38 which effectively isolates this transistor from a direct connection to ground. It will be recognized, for example, that the variable reference voltage 30 need not be used to drive the gate of transistor 50 and that any suitable reference voltage may also be used.

The low level drive transistor 40 effectively sends a logic 0 to the receiver when its gate is receiving a logic high level thereby ensuring negative input voltage is not received by the receiver. The high level drive transistor 38 passes positive input signals received from output signal 24 and effectively passes and sends logic level ones to the receiver circuit wherein the logic level "ones" do not exceed approximately $V_{DDC}$ since the overvoltage protection circuit 22 scales back the overvoltage signal.

The variable reference voltage signal allows protection of the overvoltage protection circuit during undervoltage conditions while also suitably controlling a maximum voltage to a receiver to be limited to within a predefined voltage level, such as $V_{DDC}$ minus a turn on threshold voltage ($V_T$) of transistor 54, when the input signal may be negative, and such as VDDC when input signal is bigger than 0.8 V. As such, each gate junction is maintained within an acceptable logic level while the receiver is protected from receiving overvoltage or undervoltage signals. Also, the use of nmos technology for the transistors prevents excessive current being transferred to the substrate. In addition, power consumption is lowered and fabrication cost reduced due to the single gate thicknesses employed in the single gate oxide devices.

In summary, if the input voltage at node 12 is a −0.4 V, the first output signal 24 will also be approximately −0.4 V and the inverter will then invert the signal to approximately $V_{DDC}$ minus $V_T$ where the $V_T$ is the turn on threshold voltage associated with transistor 54. This logic high level will then turn on transistor 40 which then pulls the signal 16 low or logic 0 as input to the receiver. When the input signal is a higher voltage, such as 3.3 V, which if left alone could damage the receiver, the first output signal level 24 is approximately scaled to $V_{DDC}$. This value is then inverted by inverter 36 so that the output signal from the inverter 36 is approximately 0 V, turning off transistor 40 and turning on transistor 52. The transistor 38 will then pass the $V_{DDC}$ from the input of the inverter as the high level output voltage. Consequently, the variable reference voltage signal will be set at approximately $V_{DDC}$ when the input signal level is approximately 3.3 V. In contrast, when the input voltage is a negative voltage or 0 V, for example, the reference voltage will be equal to approximately $V_{DDC}-V_T$.

It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. An extraneous voltage protection circuit comprising:
    an overvoltage protection circuit having a first transistor operatively coupled to an input signal node, that generates a first output signal and a second transistor having an input also coupled to the input signal node;
    an undervoltage protection circuit, operatively coupled to receive the first output signal from the first transistor that generates a second output signal that is operatively coupled to an input node to a protected circuit; and
    an input voltage dependent variable reference voltage source having at least a pair of transistors in parallel operatively coupled to protect the overvoltage protection circuit against undervoltage conditions on at least the input signal node.

2. The circuit of claim 1 wherein the overvoltage protection circuit includes:
    a voltage shifting circuit operatively interposed between the input node to the protected circuit and an input signal node that receives an overvoltage or undervoltage input signal, the voltage shifting circuit having:
        a first circuit, operatively coupled to the input voltage dependent variable reference voltage source and to the input signal node, configured as a unidirectional voltage follower; and
        a second circuit, operatively coupled to the input voltage dependent variable reference voltage source and to the input signal node, configured as a bi-directional voltage follower to facilitate input high voltage level shifting between the input signal node and the input node to the protected circuit.

3. The circuit of claim 2 wherein the first circuit includes a first nmos transistor having a first gate coupled to the input signal node so that the first gate receives incoming digital input signals for the protected circuit, and wherein the first nmos transistor has a first drain operatively coupled to the input signal dependent variable reference voltage source and a first source coupled to a source of a second nmos transistor associated with the second circuit.

4. The circuit of claim 3 wherein the second circuit includes the second nmos transistor having a second gate coupled to receive the input signal dependent variable reference voltage, a second drain coupled to the input signal node so that the second drain receives incoming digital input signals for the protected circuit, and a second source coupled to the first source.

5. The circuit of claim 1 wherein the input voltage dependent variable reference voltage source is operatively responsive to the first output signal and adjusts a reference voltage for the overvoltage protection circuit during undervoltage conditions.

6. The circuit of claim 1 wherein the undervoltage protection circuit shifts the first output signal from a negative voltage level to a non-negative logic zero level when the input signal is an unsuitable undervoltage condition.

7. The circuit of claim 6 wherein the undervoltage protection circuit includes at least an inverter circuit, including a first inverter transistor and second inverter transistor each having at least gates and drains, the gates operatively coupled to the first output signal and to a logic high driving transistor, an output operatively coupled to a logic low driving transistor and wherein the input dependent variable reference voltage source provides a variable reference voltage to the inverter circuit as protection against undesired gate to drain voltage ranges of the first and second inverter transistors.

8. The circuit of claim 1 wherein the overvoltage protection circuit shifts the input signal from a first logic high level to a lower logic high value when the input signal is an unsuitable overvoltage condition.

9. The circuit of claim 8 wherein the overvoltage protection circuit includes at least an overvoltage protection circuit input transistor having a gate operatively coupled to a variable reference voltage generated by the input voltage dependent variable reference voltage source and a drain operatively coupled to the input signal node such that the variable reference voltage provides a variable gate to drain voltage within a normal operating range for the overvoltage protection circuit input transistor during unsuitable undervoltage conditions.

10. The circuit of claim 1 wherein the overvoltage protection circuit, the undervoltage protection circuit and the input voltage dependent variable reference voltage source are comprised of single gate oxide devices.

11. The circuit of claim 10 wherein the single gate oxide devices are transistors having a gate oxide thickness of 30 Å or less and wherein a supply voltage for the input voltage dependent variable reference voltage source is 1.8 volts.

12. The circuit of claim 11 wherein extraneous voltage levels on the input signal node range between −0.4 volts to 3.3 volts.

13. An extraneous voltage protection circuit comprising:
an overvoltage protection circuit having a first transistor, operatively coupled to an input signal node, that generates a first output signal and a second transistor having an input also coupled to the input signal node wherein the overvoltage protection circuit shifts an input signal on the input signal node from a first logic high level to a lower logic high value when the input signal produces an unsuitable overvoltage condition;
an undervoltage protection circuit, operatively coupled to receive the first output signal from the first transistor, that generates a second output signal that is operatively coupled to an input node to a protected circuit wherein the undervoltage protection circuit shifts the first output signal from a negative voltage level to a non-negative logic zero level when an input signal on the input signal node is an undervoltage condition; and
an input voltage dependent variable reference voltage source operatively coupled to protect the overvoltage protection circuit against unsuitable undervoltage conditions from the input signal node.

14. The circuit of claim 13 wherein the overvoltage protection circuit includes:
a voltage shifting circuit operatively interposed between the input node to the protected circuit and an input signal node that receives an overvoltage or undervoltage input signal, the voltage shifting circuit having:
a first circuit, operatively coupled to the input voltage dependent variable reference voltage source and to the input signal node, configured as a unidirectional voltage follower; and
a second circuit, operatively coupled to the input voltage dependent variable reference voltage source and to the input signal node, configured as a bi-directional voltage follower to facilitate input high voltage level shifting between the input signal node and the input node to the protected circuit.

15. The circuit of claim 13 wherein the input voltage dependent variable reference voltage source is operatively responsive to the first output signal and adjusts a reference voltage for the overvoltage protection circuit during undervoltage conditions.

16. The circuit of claim 13 wherein the overvoltage protection circuit, the undervoltage protection circuit and the input voltage dependent variable reference voltage source are comprised of single gate oxide devices.

17. The circuit of claim 16 wherein the single gate oxide devices are transistors having a gate oxide thickness of 30 Å or less and wherein a supply voltage for the input voltage dependent variable reference voltage source is 1.8 volts.

18. The circuit of claim 17 wherein extraneous voltage levels on the input signal node range between −0.4 volts to 3.3 volts.

19. The circuit of claim 13 wherein the undervoltage protection circuit includes at least an inverter circuit, including a first inverter transistor and second inverter transistor each having at least gates and drains, the gates operatively coupled to the first output signal and to a logic high driving transistor, an output operatively coupled to a logic low driving transistor and wherein the input dependent variable reference voltage source provides a variable reference voltage to the inverter circuit as protection against undesired gate to drain voltage ranges of the first and second inverter transistors.

20. The circuit of claim 19 wherein the overvoltage protection circuit includes at least an overvoltage protection circuit input transistor having a gate operatively coupled to a variable reference voltage generated by the input voltage dependent variable reference voltage source and a drain operatively coupled to the input signal node such that the variable reference voltage provides a variable gate to drain voltage within a normal operating range for the overvoltage protection circuit input transistor during unsuitable undervoltage conditions.

21. An extraneous voltage protection method comprising:
transforming an overvoltage input signal to a first output signal using an overvoltage protection circuit having a first and second transistor coupled to an input node;
transforming an undervoltage input signal received on the same input node as the overvoltage input signal, using an undervoltage protection circuit; and
generating an input voltage dependent variable reference voltage to protect the overvoltage protection circuit against unsuitable undervoltage conditions caused by the undervoltage input signal.

22. The method of claim 21 including the step of adjusting the input voltage dependent variable reference voltage during undervoltage conditions in response to an output signal from the overvoltage protection circuit.

23. The method of claim 22 including the step of shifting the first output signal from a negative voltage level to a non-negative logic low level when the input signal is an unsuitable undervoltage condition.

24. The method of claim 23 including shifting a received input signal from a first logic high level to a lower logic high value when the input signal is an unsuitable overvoltage condition.

25. The method of claim 24 including the step of inverting the first output signal and providing the input dependent variable reference voltage source to provide a variable reference voltage to an inverter circuit having a first inverter transistor and second inverter transistor each having at least gates and drains as protection against undesired gate to drain voltage ranges for the first and second inverter transistors.

26. The method of claim 21 wherein the overvoltage protection circuit, the undervoltage protection circuit are comprised of single gate oxide devices.

27. The method of claim 26 wherein the single gate oxide devices are transistors having a gate oxide thickness of 30 Å or less and wherein a supply voltage for the input voltage dependent variable reference voltage source is 1.8 volts.

28. An extraneous voltage protection circuit comprising:
an overvoltage protection circuit, having a first transistor with a source, a drain, and a gate, the drain operatively coupled to an input signal node, the source generates a first output signal and a second transistor having a second drain, second gate and second source, with the second gate is also operatively coupled to the input signal and the first source coupled to the second source;
an undervoltage protection circuit, including an inverter circuit having first and second inverter transistors with gates operatively coupled to receive the first output signal from the first transistor, and drains that generate a second output signal that is operatively coupled to an input node to a protected circuit; and an input voltage dependent variable reference voltage source operatively coupled to the gate of the first transistor, to protect the overvoltage protection circuit against undervoltage conditions from the input signal node and operatively coupled to the inverter circuit wherein the input dependent variable reference voltage source provides a variable reference voltage to the inverter circuit as protection against undesired gate to drain voltage ranges of the first and second inverter transistors.

29. The circuit of claim 28 wherein the input voltage dependent variable reference voltage source is operatively responsive to the first output signal and adjusts a reference voltage for the overvoltage protection circuit during undervoltage conditions.

30. The circuit of claim 28 wherein the undervoltage protection circuit shifts the first output signal from a negative voltage level to a non-negative logic zero level when the input signal is an unsuitable undervoltage condition.

31. The circuit of claim 28 wherein the overvoltage protection circuit shifts the input signal from a first logic high level to a lower logic high value when the input signal is an unsuitable overvoltage condition.

32. The circuit of claim 28 wherein the transistors in the overvoltage protection circuit, the undervoltage protection circuit and the input voltage dependent variable reference voltage source are comprised of single gate oxide devices.

33. The circuit of claim 32 wherein the single gate oxide devices are transistors having a gate oxide thickness of 30 Å or less and wherein a supply voltage for the input voltage dependent variable reference voltage source is 1.8 volts.

34. The circuit of claim 33 wherein extraneous voltage levels on the input signal node range between −0.4 volts to 3.3 volts.

35. The circuit of claim 28 wherein the gates of the first inverter transistor and second inverter transistors are coupled to the first output signal and to a logic high driving transistor, and the drains are coupled to a logic low driving transistor and wherein the input dependent variable reference voltage source provides a variable reference voltage to the inverter circuit as protection against undesired gate to drain voltage ranges of the first and second inverter transistors.

* * * * *